United States Patent
Makabe (10) Patent No.: US 8,648,389 B2
(45) Date of Patent: Feb. 11, 2014

(54) SEMICONDUCTOR DEVICE WITH SPACER LAYER BETWEEN CARRIER TRAVELING LAYER AND CARRIER SUPPLYING LAYER

(75) Inventor: Isao Makabe, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/489,667

(22) Filed: Jun. 6, 2012

(65) Prior Publication Data
US 2012/0313145 A1 Dec. 13, 2012

(30) Foreign Application Priority Data

Jun. 8, 2011 (JP) ................................ 2011-128650
Jul. 20, 2011 (JP) ................................ 2011-159229

(51) Int. Cl.
*H01L 29/778* (2006.01)
(52) U.S. Cl.
USPC ........................................................ 257/194
(58) Field of Classification Search
USPC ........................................................ 257/194
See application file for complete search history.

(56) References Cited

U.S. PATENT DOCUMENTS

| 7,777,253 | B2 * | 8/2010 | Sato | 257/194 |
| 7,985,987 | B2 * | 7/2011 | Kaneko | 257/194 |
| 8,344,421 | B2 * | 1/2013 | Gao et al. | 257/192 |
| 2004/0155260 | A1 * | 8/2004 | Kuzmik | 257/192 |
| 2010/0270591 | A1 * | 10/2010 | Ahn | 257/194 |
| 2012/0153356 | A1 * | 6/2012 | Saunier | 257/194 |

OTHER PUBLICATIONS

Takahashi, K. (ed), "Widegap Semiconductor Optical Electrical Device," pp. 242-243 (2006).

* cited by examiner

*Primary Examiner* — Eugene Lee
(74) *Attorney, Agent, or Firm* — Venable LLP; Michael A. Sartori; Tamatane J. Aga

(57) ABSTRACT

A nitride semiconductor device is disclosed. The device includes a stack of semiconductor layers including the channel layer, the spacer layer, and the doped layer. The spacer layer is made of AlN while the doped layer is InAlN. A feature of the embodiment is that the spacer layer has a thickness of 0.5 to 1.25 nm.

6 Claims, 9 Drawing Sheets

SEMICONDUCTOR DEVICE WITH SPACER LAYER BETWEEN CARRIER TRAVELING LAYER AND CARRIER SUPPLYING LAYER

BACKGROUND OF THE INVENTION

1. Field of the Invention

The present invention relates to a semiconductor device, in particular, one embodiment of the semiconductor device is, what is called, the high-electron mobility transistor (HEMT) formed by nitride semiconductor materials.

2. Related Prior Arts

Nitride semiconductor materials have been applicable to a power device showing a high output in higher frequencies. One prior art has disclosed a HEMT that includes a buffer layer, GaN carrier traveling layer, which is often called as a channel layer, AlGaN carrier supplying layer, which is sometimes called as doped layer, each layers being sequentially grown on a substrate, and utilizes a two dimensional electron gas (2DEG) formed in the channel layer at an interface against the doped layer.

In order to improve the high frequency performance of HEMT device further, the trans-conductance of the device is necessary to be enhanced. Specifically, the sheet resistance of the 2DEG should be decreased as possible.

One possible solution to decrease the sheet resistance of the 2DEG, the aluminum (Al) composition in AlGaN doped layer may be increased to enhance the carrier concentration in 2DEG. However, the lattice mismatching of AlGaN doped layer becomes large as the Al composition increases, which degrades the mobility of the carrier in 2DEG and the sheet resistance thereof oppositely increases.

On the other hand, thinner AlGaN doped layer with a normal Al composition decreases the carrier concentration in 2DEG to increase the sheet resistance thereof. Thus, the HEMT with AlGaN doped layer has an inherent restraint in the high frequency performance thereof.

SUMMARY OF THE INVENTION

One aspect of the present invention relates to a semiconductor device that includes a substrate, a channel layer, a spacer layer, and a doped layer, where they are stacked on the substrate in this order to form a 2DEG in the channel layer at the interface to the spacer layer. The channel layer may be made of a nitride semiconductor material, typically, GaN. A feature of the embodiment is that the spacer layer has a thickness thicker than, or equal to, 0.5 nm but thinner than, or equal to, 1.25 nm. Further preferably, the thickness of the spacer layer is less than, or equal to, 0.8 nm to improve the sheet resistance of the 2DEG and the surface flatness of the doped layer consistently.

The spacer layer may be made of AlN; while, the doped layer may be made of InAlN. The spacer layer made of AlN has an In composition thereof greater than, or equal to, 12% but less than, or equal to 35%, or preferably less than, or equal to 18% not to cause large lattice-mismatching to GaN channel layer.

Another aspect of the present invention relates to a method for forming a semiconductor device. The method comprises steps of: (a) growing a channel layer made of GaN on a substrate; and (b) growing a doped layer made of InAlN on GaN channel layer. A feature of the method according to an embodiment is that the channel layer and the doped layer are grown by using ammonia as a source material for the nitrogen and the doped layer is grown under a partial pressure of the ammonia smaller than a partial pressure of the ammonia in the growth of the channel layer.

Specifically, the partial pressure of the ammonia in the growth of the doped layer may be 0.15 to 0.35, preferably 0.2 to 0.3 to make the reduction of the sheet resistance in the 2DEG and the enhancement of the surface flatness of the doped layer consistent. The process may use hydrogen (H) as a carrier gas in the growth of the channel layer, while, nitrogen (N) may be applicable as a carrier gas for the growth of the doped layer. The doped layer is preferably grown in a thickness thereof less than 10 nm. Even when the doped layer is grown so thin, the 2DEG induced in the channel layer at the interface to the spacer layer has an enough carrier concentration because of a large difference in the spontaneous polarization and a large discontinuity in the conduction band between GaN channel layer and InAlN doped layer.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS (First Embodiment)

Figure 1:
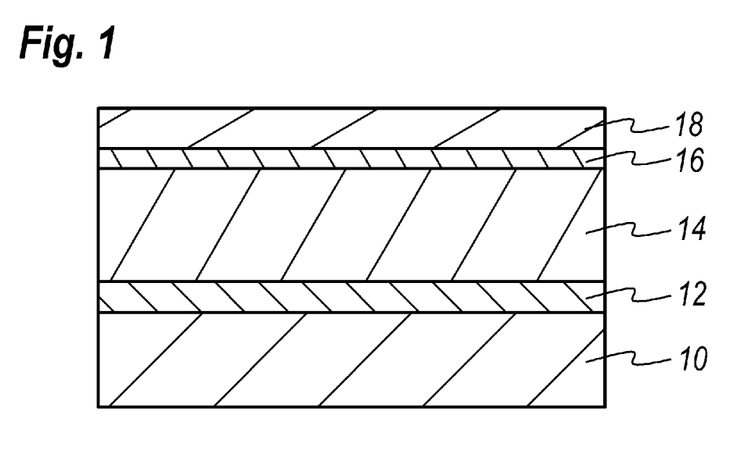
FIG. 1 shows a cross section of a specimen to evaluate the sheet resistance of the 2DEG and the surface flatness of the doped layer against the thickness of the spacer layer.

Experiments performed to evaluate a thickness of the spacer layer will be firstly described. FIG. 1 is a cross section of epitaxially grown layers for investigating a relation of the sheet resistance of the 2DEG against the surface morphology of the doped layer, which is made of InAlN to supply carriers into the 2DEG. The epitaxial layers may be grown by, for instance, the metal organic chemical vapor deposition (MOCVD).

Referring to FIG. 1 and table 1 below described, a substrate 10 made of SiC is set within the growth chamber of the MOCVD apparatus; then, a series of layers from AlN buffer layer 12 to AlN spacer layer 16 are sequentially grown on the SiC substrate 10 under conditions of the source materials by hydrogen (H) without any annotations as a carrier gas, the growth temperature, and the thickness of respective layer shown in table 1. In table 1, TMA, TMG, and TMI each means tri-methyl-aluminum, tri-methyl-gallium, and tri-methyl-indium.

TABLE 1 growth conditions of respective layers

| layer | source | T | t |
|---|---|---|---|
| SiC substrate 10 | | | |
| AlN buffer layer 12 | TMA, NH$_3$ | 1000° C. | 20 nm |
| GaN channel layer 14 | TMG, NH$_3$ | 1000° C. | 1000 nm |
| AlN spacer layer 16 | TMA, NH$_3$ | 1000° C. | 0-2 nm |
| InAlN doped layer 18 | TMI, TMA, NH$_3$ | 800° C. | 6 nm |

After the growth of the AlN spacer layer 16, an InAlN doped layer 18 were grown on the AlN spacer layer 16 by changing the carrier gas from hydrogen (H) to nitrogen (N) under conditions shown in table 1.

The InAlN for the doped layer 18 has the indium (In) composition to be 17% at which InAlN matches the lattice constant thereof with that of GaN of the channel layer 14, and 2DEG with a high carrier concentration may be formed in the channel layer 14 at the interface to the AlN spacer layer 16 because of a large difference of the spontaneous polarization between InAlN and GaN, and a large band discontinuity of the conduction band between InAlN and GaN. That is, even when InAlN doped layer 18 is formed in thinner; the sheet resistance of the 2DEG in the channel layer 14 becomes lower.

The AlN spacer layer 16 between GaN channel layer 14 and InAlN doped layer 18 may enhance the mobility in 2DEG because the scattering of carriers traveling in 2DEG by dopants in the InAlN doped 18 may be reduced, that is, the carriers traveling in 2DEG may be spatially separated from dopants in InAlN doped layer 18. In an alternate, the spacer layer 16 may be made of AlGaN; but the layer made of AlN is preferable from a viewpoint of the productivity.

Figure 2:
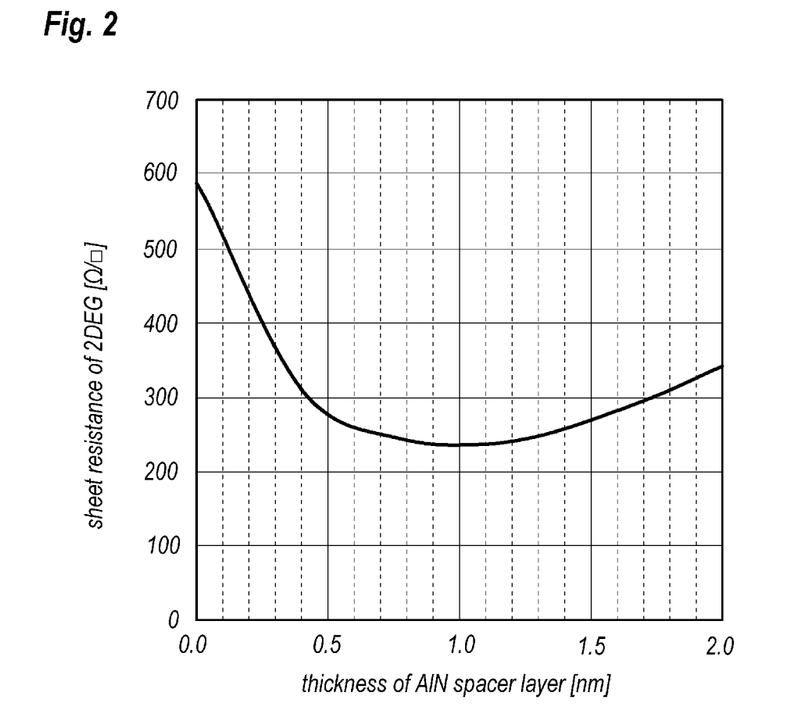
FIG. 2 shows dependence of the sheet resistance of the 2DEG against the thickness of the spacer layer.
Figure 3:
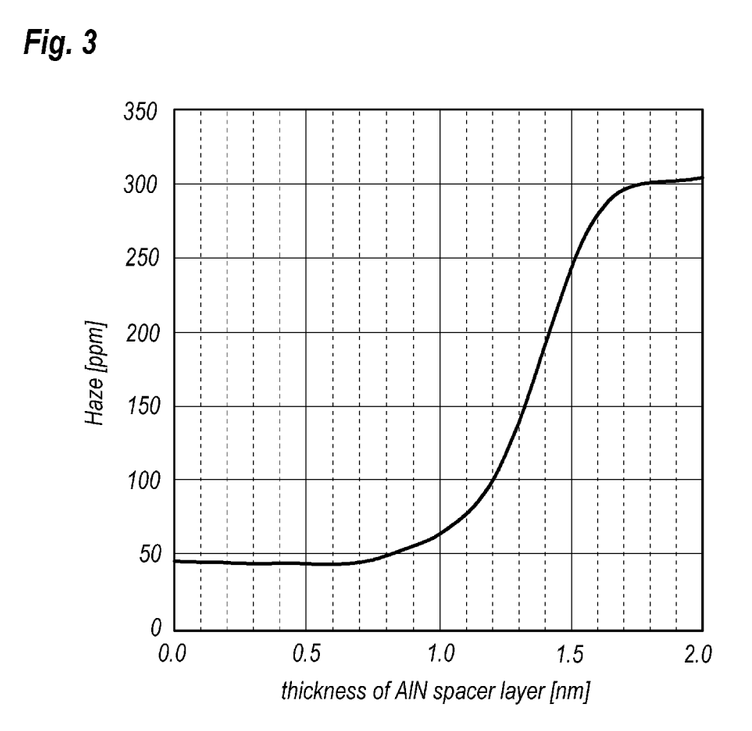
FIG. 3 shows dependence of the surface flatness of the doped layer against the thickness of the spacer layer, where the surface flatness is evaluated through Haze index.

The sheet resistance of the 2DEG in GaN channel layer 14 and the surface flatness of InAlN doped layer 18 were evaluated for various devices each having AlN spacer layer 16 with thicknesses of 0 to 2 nm. FIG. 2 shows a behavior of the sheet resistance of the 2DEG against the thickness of AlN spacer layer 18; while, FIG. 3 shows a behavior of the flatness of InAlN doped layer 18 against the thickness of AlN spacer layer 16, where the flatness is evaluated by the reflection Haze of InAlN doped layer 18. In those experiments, the thickness of AlN spacer layer was measured by Transmission Electron Microscope (TEM).

Referring to FIG. 2, the sheet resistance of the 2DEG decreases in specimens having a substantial AlN spacer layer 16 compared with a case of no spacer layer 16. Moreover, the sheet resistance of the 2DEG depends on the thickness of AlN spacer layer 16; specifically, the sheet resistance drastically decreases until the thickness of AlN spacer layer 16 reaches 0.5 nm and gradually decreases from 0.5 to 1.0 nm. However, the sheet resistance increases as the thickness of AlN spacer layer 16 increases from 1.0 nm.

Based on the behavior shown in FIG. 2, the spacer layer 16 made of AlN preferably has a thickness greater than 0.5 nm to decrease the sheet resistance of the 2DEG. When the doped layer 18 is made of AlGaN, the 2DEG is hard to reduce the sheet resistance thereof less than 300 Ω/□. While, the doped 18 made of InAlN may reduce the sheet resistance of the 2DEG less than 300 Ω/□ by using AlN spacer layer with a thickness of 0.5 to 1.5 nm.

The surface flatness of InAlN doped layer 18 will be evaluated by referring to FIG. 3. The surface of InAlN doped layer 18 is necessary to be flat as possible because the surface morphology thereof substantially affects the electron mobility in 2DEG. Poor surface flatness results in the reduction of the electron mobility in 2DEG, which increases the sheet resistance thereof, decreases the trans-conductance of a device using the 2DEG, and resultantly degrades the high frequency performance of the device.

As shown in FIG. 3, the surface flatness of InAlN doped layer 18 strongly depends on the thickness of AlN spacer layer 16. Specifically, the Haze index of InAlN layer 18 stays less than 50 ppm, which means that the surface of InAlN layer shows an excellent flatness, in a region where the thickness of AlN spacer layer 16 is less than 0.8 nm. Then, the Haze index increases as the thickness of AlN spacer layer 16 increases, and it drastically increases in a region where the thickness of AlN spacer layer 16 greater than 1.25 nm, at which the Haze index reaches about 125 ppm; and finally saturates, independent of the thickness of AlN spacer layer, around 300 ppm when the thickness of AlN spacer layer 16 is greater than 1.75 nm. Thus, AlN spacer layer preferably has a thickness less than 1.25 nm. In those experiments above described, the Haze index means a ratio of the scattered light to the whole light reflected at surface of InAlN doped layer 18.

The dependence of the sheet resistance of the 2DEG shown in FIG. 2 and that of the surface flatness of the InAlN doped layer 18 on the thickness of AlN spacer layer 16 were independent of the growth conditions of AlN spacer layer 16, such as the pressure within the growth chamber, the supplying ratio of source gasses for group V and III semiconductor materials, and so on. Similar results were obtained for various growth conditions for AlN spacer layer; and only the thickness thereof affects the sheet resistance of the 2DEG, and the surface flatness of InAlN doped layer 18.

Next, some embodiments of a semiconductor device operable in higher frequency regions will be described as referring to FIG. 4, which is a cross section of the semiconductor device 1. The device 1 comprises, on the semiconductor substrate 10 made of SiC, the buffer layer 12 made of AlN with a thickness of 20 nm and the channel layer 14 made of GaN with a thickness of 1000 nm. Grown on GaN channel layer 14 is the spacer layer 16 made of AlN with a thickness of 0.5 to 1.25nm. Then, InAlN doped layer 18 is grown on AlN spacer layer 16 by the condition of the In composition of 17% and the thickness of 6 nm to induce the 2DEG 20 in GaN channel layer 14 at the interface to AlN spacer layer 16. The topmost layer 22 made of GaN with a thickness of 5 nm is formed on InAlN doped layer 18, which is often called as a cap layer. The device 1 shown in FIG. 4 further includes electrodes of the gate 24, the source 26 and the drain 28 on GaN cap layer 22, where the latter of the two electrodes put the gate 24 therebetween. The gate electrode 24 may be made of stacked metals of nickel (Ni) and gold (Au) from the side of GaN cap layer 22; while, the other two electrodes, 26 and 28, may be made of stacked metals of titanium (Ti) and aluminum (Al). Regions between electrodes, 24 to 28, where GaN cap is exposed, may be covered by the insulating layer 30 made of silicon nitride (SiN).

Layers from the buffer layer 12 to InAlN doped layer 18 may be grown by the same conditions shown in table 1 above described, while, GaN cap layer 22 may be grown on InAlN doped layer 18 by the conditions in table 2:

TABLE 2

Growth condition of topmost layer

| layer | source | T | t |
|---|---|---|---|
| GaN cap layer 22 | TMG, NH$_3$ | 1000° C. | 5 nm |

The electrodes, 24 to 26, may be formed by, for instance, the metal evaporation and the subsequent lift-off process; while, the insulating layer 30 may be formed by, for instance, the plasma enhanced vapor phase deposition (p-CVD).

Thus, according to the first embodiment of the invention, the device 1 provides GaN channel layer 14 on SiC substrate 10, AlN spacer layer 16 on the channel layer 14, InAlN doped layer 18 on the spacer layer 16, the gate electrode 24, and source and drain electrodes, 26 and 28, putting the gate electrode 24 therebetween. Further specifically, AlN spacer layer 16 is in contact with GaN channel layer 14, InAlN doped layer 18 is in contact with AlN spacer layer 16; and the thickness of AlN spacer layer is thicker than, or equal to, 0.5 nm but thinner than, or equal to, 1.25 nm. Because the poor surface flatness of InAlN doped layer 18 results in the degradation of the mobility in the 2DEG 20, the high frequency performance of the device becomes inferior. The device according to the embodiment, however, has the thickness of AlN spacer layer thicker than, or equal to, 0.5 nm but thinner than, or equal to, 1.25 nm, which results in an excellent surface flatness of InAlN doped layer 18; thus the device 1 may show a superior performance in high frequencies.

A thin AlN spacer layer 16, as shown in FIG. 3, makes the Haze index small to obtain an excellent surface morphology of InAlN doped layer 18. Thus, AlN spacer layer 16 preferably has a thickness less than 1.0 nm, further preferably less than 0.8 nm. Accordingly, AlN spacer layer 16 preferably has a thickness of thicker than, or equal to, 0.5 nm but thinner than, or equal to, 1.0 nm, further preferably thicker than, or equal to 0.5 nm, and thinner than, or equal to, 0.8 nm to obtain a superior surface flatness.

When AlN spacer layer 16 has a thickness greater than 0.5 nm but less than 1.25 nm, the Haze index of InAlN doped layer 18 may be less than 120 ppm; moreover, when the thickness of AlN spacer layer 16 is set to be greater than 0.5 nm but less than 0.8 nm, the Haze index of InAlN doped layer 18 may become less than 50 ppm.

As shown in FIG. 2, the sheet resistance of the 2DEG 20 drastically decreases until the thickness of AlN spacer layer becomes 0.5 nm, then gradually decreases until the thickness thereof reaches 1.0 nm. Based on those findings, AlN spacer layer 16 preferably has a thickness greater than 0.6 nm, more preferably greater than 0.8 nm. Accordingly, the device 1 preferably has AlN spacer layer 16 with a thickness greater than, or equal to, 0.6 nm but thinner than, or equal to, 1.25 nm to secure the excellent high frequency performance.

The cap layer 22 made of GaN, which fully covers InAlN doped layer 18, may be in contact with InAlN doped layer 18. Because InAlN doped layer 18 contains aluminum (Al), the layer 18 is, when exposed in an air, likely to accelerate the oxidization of aluminum (Al) to cause oxides such as aluminum oxide (AlO). Such an oxide sometimes brings failures of the device. Thus, the device 1 preferably provides GaN cap layer 22 from a viewpoint to suppress the oxidization of InAlN doped layer 18.

Figure 4:
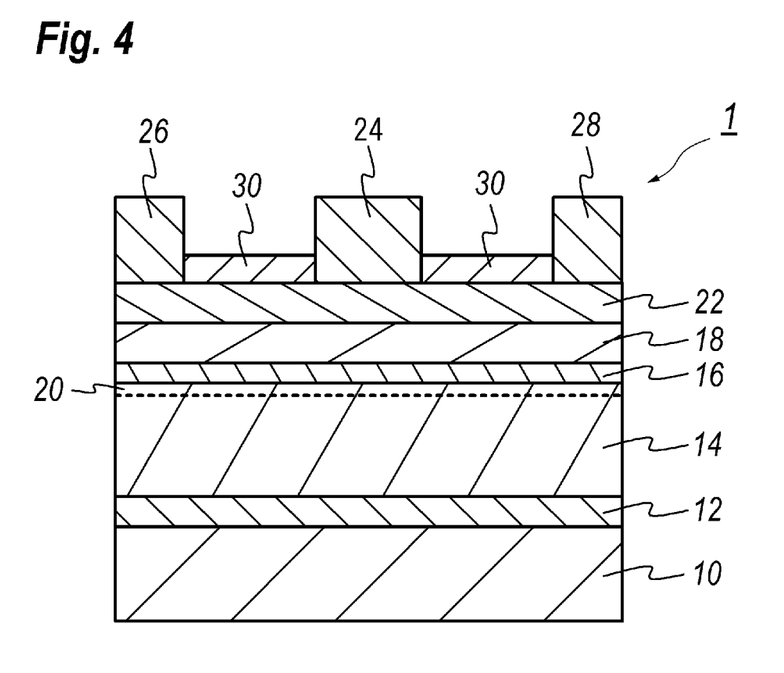
FIG. 4 shows a cross section of a semiconductor device according to the first embodiment of the invention.

The embodiment illustrated in FIG. 4 has no recess in GaN cap layer 22 just beneath the gate electrode 24, nor under the source and drain electrodes, 26 and 28. However, the device 1 may provide the gate recess beneath the gate electrode 24, and/or ohmic recesses under the drain and source electrodes, 26 and 28.

The embodiment shown in FIGS. 1 and 4 has InAlN doped layer 18 with indium (In) composition of 17% with respect to aluminum (Al). However, the device does not restrict the In composition of InAlN doped layer 18 in such a condition. The doped layer 18 may have the indium composition from 12 to 35%. An InAlN compound material with the indium composition out of this range may cause cracks because of a large lattice mismatching along the a-crystal orientation. In addition, the indium composition greater than 18% is likely to increase the sheet resistance of the 2DEG 20; and the indium composition of 17 to 18% is extremely preferable because InAlN with the indium composition of 17 to 18% is substantially lattice-matched with GaN.

The cap layer made of GaN 22 may be i-type and n-type. The n-type GaN may stabilize the surface charge. Moreover, when n-type GaN is grown at a higher temperature, the activation of n-type dopants may be enhanced to stabilize the surface charge, which results in the stable band diagram of the device 1. A silane (SiH$_4$) may be used as a source material of the n-type dopants.

Although the embodiments shown in FIGS. 1 and 4 uses the semiconductor substrate 10 made of SiC, other types of substrates are applicable to the device 1, such as silicon (Si), GaN, sapphire, gallium oxide (Ga$_2$O$_3$), and so on. The embodiments applies AlN for the buffer layer 12, but other materials, such as InN, InGaN, InAlN, AlInGaN, and other materials including nitrogen (N) may be used. Moreover, tri-ethyl-aluminum (TEA) and tri-ethyl-gallium (TEG) are applicable to source materials of aluminum (Al) and gallium (Ga), respectively. Still further, the embodiments uses GaN channel layer 14, but the device 1 is not restricted to GaN; but other nitride semiconductor materials generally shown by $B_\alpha Al_\beta Ga_\gamma In_{1-\alpha-\beta-\gamma}N$, where α to γ satisfies the following relation:

$$2.55\alpha+3.11\beta+3.19\gamma+3.55(1-\alpha-\beta-\gamma)=3.55X+3.11(1-X).$$

(Second Embodiment)

Next, conditions for growing InAlN doped layer will be investigated. As described above, the thickness of AlN spacer layer strongly depends of the surface morphology of InAlN doped layer; however, other factors also affect the surface flatness and morphology of InAlN doped layer. One factor is a partial pressure of ammonia gas against the total pressure of source gasses when InAlN doped layer is grown.

Figure 5:
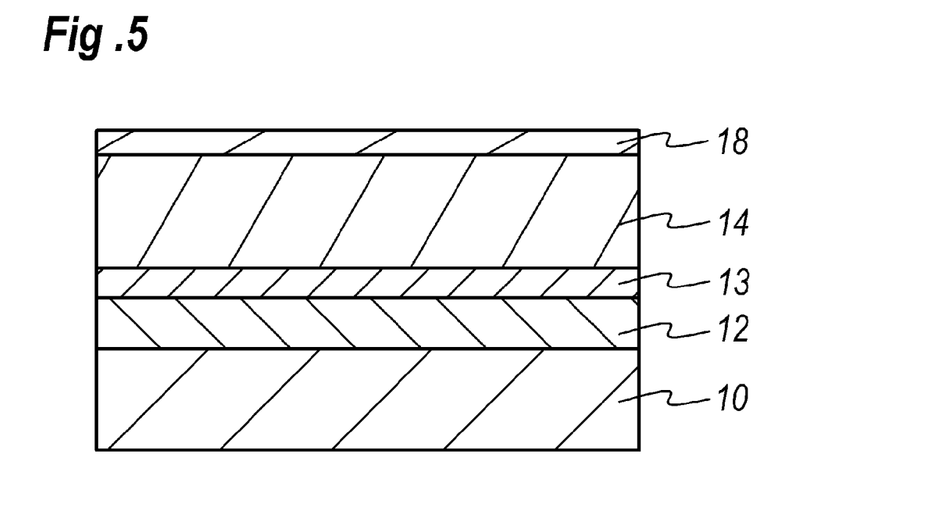
FIG. 5 shows a cross section of a specimen to evaluate the relating of the sheet resistance of the 2DEG and the surface flatness of the doped layer against the ammonia partial pressure in the growth of the doped layer.

Experiments to investigate the partial pressure of ammonia first prepared specimens each grown under conditions shown in table 3 below:

TABLE 3 growth conditions of respective layers

| layer | Source | T | t |
|---|---|---|---|
| SiC substrate 10 | | | |
| AlN layer 12 | TMA, NH$_3$ | 1000° C. | 300 nm |
| AlGaN layer 13 | TMA, TMG, NH$_3$ Al composition 50% | 1000° C. | 150 nm |
| GaN channel layer 14 | TMG, NH$_3$ NH$_3$ partial pressure 0.5 | 1000° C. | 500 nm |
| InAlN doped layer 18 | TMI, TMA, NH$_3$ In composition 17% NH$_3$ partial pressure 0.1-0.5 | 750° C. | 10 nm |

The AlN layer 12 and AlGaN layer 13 correspond to the buffer layer 12 in the aforementioned embodiment. The process shown in table 3 changes the carrier gas from hydrogen (H) for AlN layer 12, AlGaN layer 13, and GaN layer 14 to nitrogen for InAlN layer 18. The partial pressure of ammonia ($NH_3$) means a ratio of the pressure of ammonia to the pressure of whole gasses supplied within the growth chamber of the MOCVD apparatus including the carrier gas. The partial pressure substantially coincides with the mole ratio of gasses provided within the growth chamber.

As described in the first embodiment, InAlN thus grown on GaN channel layer 14 matches the lattice constant thereof with that of GaN in the channel layer 14, and may introduce the 2DEG with a high carrier concentration because of a large difference in the spontaneous polarization and a large discontinuity in the conduction band between InAlN doped layer 18 and GaN channel layer 14. The InAlN doped layer 18, even when it is grown in thin enough, may reduce the sheet resistance of the 2DEG.

Figure 6:
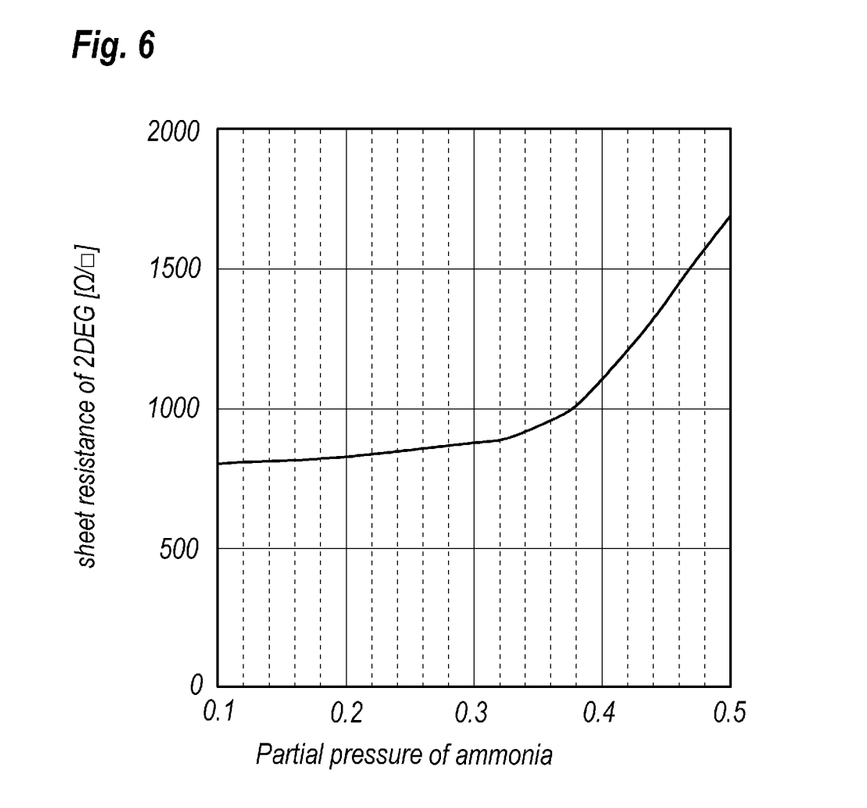
FIG. 6 shows a behavior of the sheet resistance of the 2DEG against the ammonia partial pressure.

The sheet resistance of GaN channel layer 14 and the surface flatness of InAlN doped layer 18 were evaluated, as those of the first embodiment, by varying the ammonia partial pressure from 0.1 to 0.5 for growing InAlN doped layer 18. FIG. 6 shows a behavior of the sheet resistance of GaN channel layer 14 against the ammonia partial pressure, while, FIG. 7 shows a behavior of the surface flatness of InAlN doped layer 18 also against the ammonia partial pressure.

Referring to FIG. 6, the sheet resistance of 2DEG depends on the partial pressure of ammonia. Specifically, the sheet resistance of 2DEG gradually increases as the partial pressure of ammonia increases until the partial pressure reaches around 0.35. Exceeding 0.35 for the partial pressure of ammonia, the sheet resistance of the 2DEG rapidly increases. Accordingly, it is strongly preferable for the ammonia partial pressure to be less than 0.35.

Figure 7:
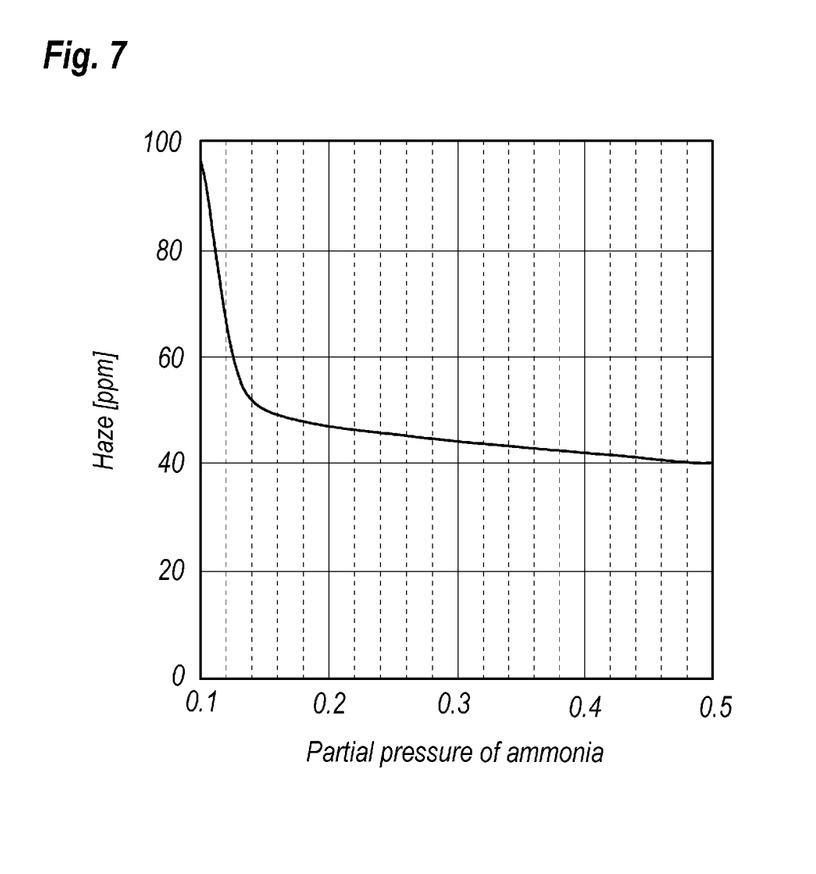
FIG. 7 shows a behavior of the surface flatness, evaluated by the Haze index, against the ammonia partial pressure.

Referring to FIG. 7, the surface flatness of InAlN doped layer 18 also depends on the partial pressure of ammonia. Specifically, the Haze index of InAlN doped layer 18 rapidly falls as the ammonia partial pressure increases but less than 0.15. Exceeding 0.15 for the ammonia partial pressure, the Haze index of InAlN doped layer 18 moderately decreases as the increase of the ammonia partial pressure. For instance, the Haze index of InAlN layer 18 is around 50 ppm at 0.15 for the ammonia partial pressure, then, the Haze index decreases to 47 ppm at 0.2 for the ammonia partial pressure. Thus, the ammonia partial pressure is preferable to be greater than 0.15 from a view point of the surface flatness of InAlN doped layer 18.

Figure 9:
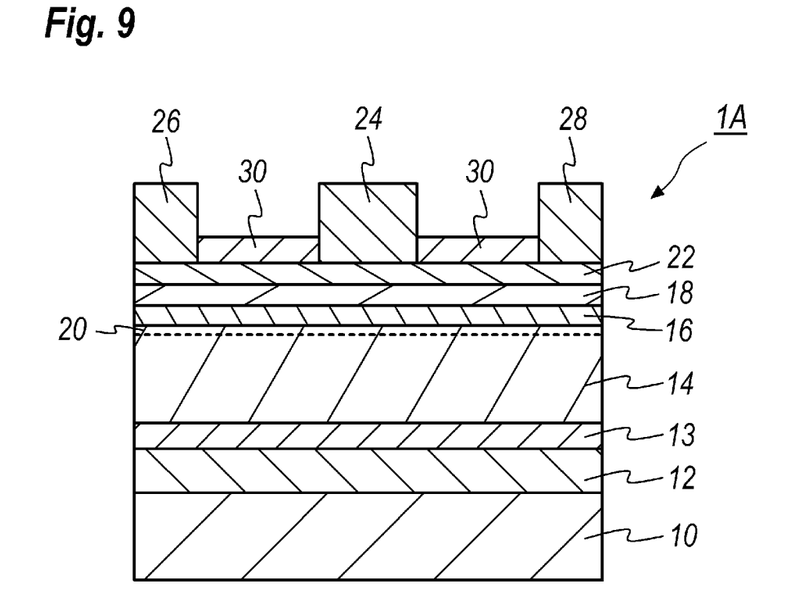
FIG. 9 is a cross section of a semiconductor device according to the second embodiment of the invention.

Base on the findings above described, a nitride semiconductor device operable in high frequencies is formed. Next, a method and an arrangement of the semiconductor device according to the second embodiment of the invention will be described.

FIG. 9 shows a cross section of a semiconductor device 1A according to the second embodiment of the invention. Semiconductor layers are grown on SiC substrate under conditions shown in Table 3; however the device 1A may further provide an AlN spacer layer 16 grown on GaN channel layer and the cap layer 22 grown on InAlN doped layer. Conditions to grow AlN spacer layer 16 and GaN cap layer are summarized in table 4.

TABLE 4 growth conditions of spacer layer and cap layer

| layer | Source | T | t |
|---|---|---|---|
| AlN spacer layer 16 | TMA, $NH_3$ | 1000° C. | 1 nm |
| GaN cap layer 22 | TMG, $NH_3$ | 1000° C. | 5 nm |

In the growth of AlN spacer layer 16, the hydrogen (H) is used as carrier gas same as layers grown in advance. After the growth of AlN space layer 16, the carrier gas is changed to nitrogen (N) for growing InAlN doped layer. The carrier gas is changed to hydrogen again from nitrogen after the growth of InAlN doped layer. The electrodes, 24 to 28, and the insulating layer 30 may be formed in the same manner as those of the aforementioned embodiment.

Figure 8:
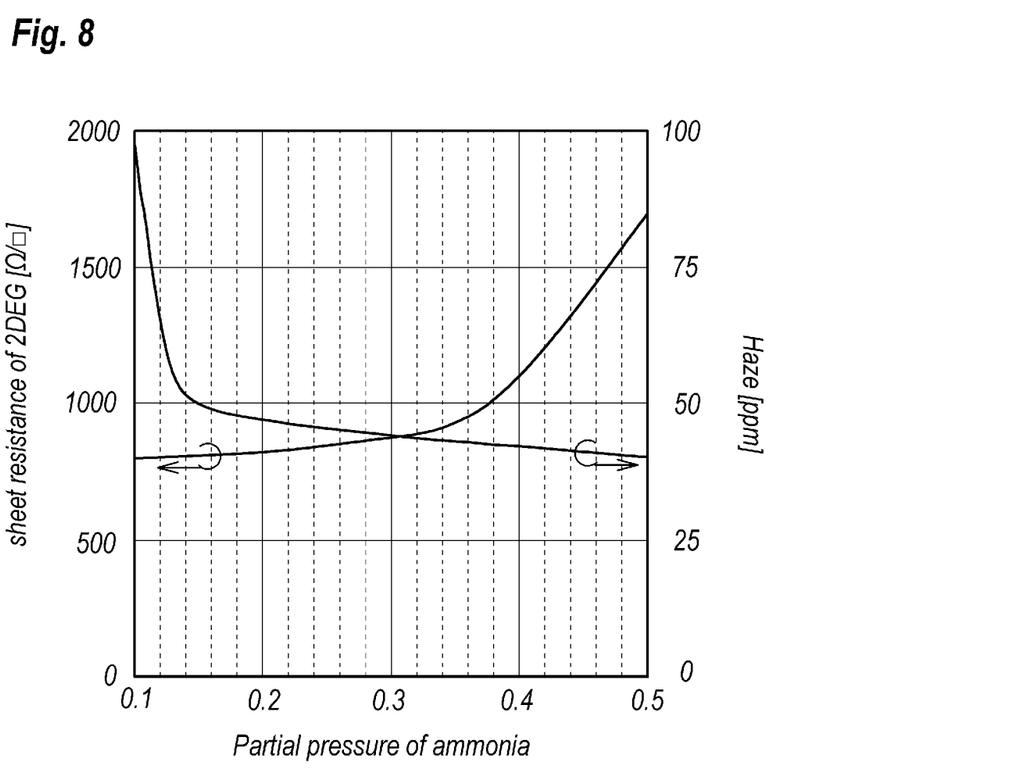
FIG. 8 shows a preferable range of the ammonia partial pressure.

Moreover, InAlN doped layer may be grown in a condition where the ammonia partial pressure is set to be 0.15 to 0.35, in which the reduction of the sheet resistance of the 2DEG 20 and the improvement of the surface flatness of InAlN doped layer 18 may be consistent as shown in FIG. 8.

Thus, the present embodiment for forming InAlN doped layer sets the ammonia partial pressure in a range from 0.15 to 0.35; then, three electrodes are arranged on GaN cap layer 22. As described in FIG. 7, the unevenness of the surface of InAlN doped layer 18 brings the degradation of the carrier mobility in the 2DEG 20 to increase the sheet resistance thereof. However, the embodiment of the invention sets the ammonia partial pressure for growing InAlN doped layer 18 to be greater than 0.15, which improves the surface flatness of InAlN doped layer 18.

At the same time, the embodiment of the invention sets the ammonia partial pressure for growing InAlN doped layer 18 to be less than 0.35, which may reduce the sheet resistance of the 2DEG. Thus, the device thus formed may suppress the degradation of the high frequency performance thereof.

As shown in FIG. 8, the sheet resistance of the 2DEG 20 reduces as the ammonia partial pressure decreases, while, the surface flatness of InAlN doped layer 18 improves as the ammonia partial pressure thereof increases. Base on these findings, the ammonia partial pressure is preferably between 0.18 and 0.32, or further preferably between 0.2 and 0.3.

The embodiment shown in FIG. 9 and tables 3 and 4 grows GaN channel layer under the condition for the ammonia partial pressure of 0.5, while, InAlN doped layer under the condition for the partial pressure thereof 0.15 to 0.35. In other words, InAlN doped layer 18 is grown under the condition of the ammonia partial pressure lower than the condition for the growth of GaN channel layer 14. The ammonia partial pressure may be adjusted by the flow rate of the ammonia gas; that is, setting the flow rate of the ammonia gas for InAlN doped layer 18 lower than that for GaN channel layer 14. For instance, the embodiment to form the device 1A shown in FIG. 9 sets the flow arte of TMG and ammonia to be 20 ml/min and 10 l/min, respectively, in the growth of GaN channel layer 14; while, the process sets the flow rate of TMI, TMA, and ammonia to be 30 ml/min, 40 ml/min, and 5 l/min, respectively, for the grown of InAlN doped layer 18.

In view of some possible embodiments, it will be recognized that the illustrated embodiments include only examples and should not be taken as a limitation on the scope of the invention. Rather, the invention is defined by the following claims. Therefore, we claim as the invention all such embodiments that come within the scope of these claims.

I claim:
1. A semiconductor device, comprising:
a substrate;
a channel layer made of GaN and formed on the substrate;
a spacer layer made of AlN and formed in the channel layer, the spacer layer forming a two-dimensional electron gas (2DEG) in the channel layer at the interface to the spacer layer; and
a doped layer made of InAlN and formed on the spacer layer, the doped layer having a composition of indium (In) greater than, or equal to 12% and less than, or equal to 18%,
wherein the spacer layer has a thickness greater than, or equal to 0.5 nm and thinner than, or equal to 0.8 nm, and
wherein the doped layer has a Haze index less than 50 ppm, and the 2DEG has sheet resistance less than 300 Ω/□.

2. The semiconductor device of claim 1,
further including a topmost layer formed on the doped layer, the topmost layer including gallium nitride (GaN).

3. The semiconductor device of claim 1,
further including a gate electrode, a source electrode, and a drain electrode, each being formed on the doped layer,
wherein the source electrode and the drain electrode put the gate electrode therebetween.

4. The semiconductor device of claim 3,
further including a cap layer made of GaN and formed on the doped layer,
wherein the gate, source, and drain electrodes are provided on the cap layer.

5. The semiconductor device of claim 4,
further including an insulating layer for covering the cap layer exposed between gate, source, and drain electrodes.

6. The semiconductor device of claim 1,
wherein the substrate is made of one of silicon carbide (SiC), silicon (Si), GaN, sapphire, and gallium oxide.

* * * * *